United States Patent
Clifton

(10) Patent No.: US 9,059,201 B2
(45) Date of Patent: Jun. 16, 2015

(54) TRANSISTOR WITH LONGITUDINAL STRAIN IN CHANNEL INDUCED BY BURIED STRESSOR RELAXED BY IMPLANTATION

(71) Applicant: Paul A. Clifton, Redwood City, CA (US)

(72) Inventor: Paul A. Clifton, Redwood City, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 39 days.

(21) Appl. No.: 13/742,067

(22) Filed: Jan. 15, 2013

(65) Prior Publication Data

US 2014/0199813 A1 Jul. 17, 2014

Related U.S. Application Data

(63) Continuation of application No. 12/768,895, filed on Apr. 28, 2010, now Pat. No. 8,361,868.

(51) Int. Cl.
*H01L 21/336* (2006.01)
*H01L 29/66* (2006.01)
*H01L 21/8238* (2006.01)
*H01L 21/84* (2006.01)

(52) U.S. Cl.
CPC .. *H01L 29/66477* (2013.01); *H01L 21/823807* (2013.01); *H01L 21/823814* (2013.01); *H01L 21/823878* (2013.01); *H01L 21/84* (2013.01)

(58) Field of Classification Search
USPC ......... 438/510, 478, 483, 199, 229, 197, 517, 438/518
See application file for complete search history.

(56) References Cited

U.S. PATENT DOCUMENTS

| 4,994,866 A | 2/1991 | Awano |
| 5,155,571 A | 10/1992 | Wang et al. |

(Continued)

FOREIGN PATENT DOCUMENTS

| EP | 1 231 643 A2 | 8/2002 |
| EP | 1 231 643 A3 | 10/2004 |

(Continued)

OTHER PUBLICATIONS

Bower, et al., "Low Temperature Si3N4 Direct Bonding," Department of Electrical and Computer Engineering, University of California, Department of Mechanical, Aeronautical and Material Engineering, University of California, Davis, CA 95616, Appl. Phys. Lett. 62 (26), Jun. 28, 1993, pp. 3485-3487.

(Continued)

*Primary Examiner* — Savitr Mulpuri
(74) *Attorney, Agent, or Firm* — Orrick Herrington & Sutcliffe LLP

(57) ABSTRACT

Processes for making field effect transistors relax a buried stressor layer to induce strain in a silicon surface layer above the buried stressor layer. The buried stressor layer is relaxed and the surface layer is strained by implantation into at least the buried stressor layer, preferably on both sides of a portion of the surface layer that is to be stressed. For example, implanting ions through the surface silicon layer on either side of the gate structure of the preferred FET implementation into an underlying stressor layer can induce strain in a channel region of the FET. This process can begin with a silicon or silicon-on-insulator substrate with a buried silicon germanium layer having an appropriate thickness and germanium concentration. Other stressor materials can be used.

5 Claims, 2 Drawing Sheets

(56) References Cited

U.S. PATENT DOCUMENTS

| | | | |
|---|---|---|---|
| 5,503,704 | A | 4/1996 | Bower et al. |
| 5,904,860 | A | 5/1999 | Nagakubo et al. |
| 6,406,973 | B1 | 6/2002 | Lee |
| 6,492,216 | B1 | 12/2002 | Yeo et al. |
| 6,498,359 | B2 | 12/2002 | Schmidt et al. |
| 6,600,170 | B1 | 7/2003 | Xiang |
| 6,707,106 | B1 | 3/2004 | Wristers et al. |
| 6,881,635 | B1 | 4/2005 | Chidambarrao et al. |
| 6,902,991 | B2* | 6/2005 | Xiang et al. ............ 438/510 |
| 6,927,138 | B2 | 8/2005 | Takenaka |
| 7,019,326 | B2 | 3/2006 | Cea et al. |
| 7,138,310 | B2 | 11/2006 | Currie et al. |
| 7,202,513 | B1 | 4/2007 | Chidambarrao et al. |
| 7,338,834 | B2 | 3/2008 | Clifton |
| 7,388,278 | B2 | 6/2008 | Holt et al. |
| 7,700,416 | B1* | 4/2010 | Clifton et al. ............ 438/142 |
| 8,395,213 | B2* | 3/2013 | Clifton et al. ............ 257/347 |
| 8,685,847 | B2* | 4/2014 | Majumdar et al. ............ 438/517 |
| 8,731,017 | B2* | 5/2014 | Clifton et al. ............ 372/45.011 |
| 2001/0048119 | A1 | 12/2001 | Mizuno et al. |
| 2004/0021179 | A1 | 2/2004 | Lee et al. |
| 2004/0026765 | A1 | 2/2004 | Currie et al. |
| 2005/0093021 | A1 | 5/2005 | Ouyang et al. |
| 2005/0106792 | A1 | 5/2005 | Cea et al. |
| 2005/0133817 | A1 | 6/2005 | Huang et al. |
| 2005/0255667 | A1 | 11/2005 | Arghavani et al. |
| 2006/0081837 | A1 | 4/2006 | Bedell et al. |
| 2006/0220127 | A1* | 10/2006 | Mantl ............ 257/347 |
| 2008/0116517 | A1 | 5/2008 | Anderson |
| 2008/0124858 | A1 | 5/2008 | Nguyen et al. |
| 2008/0179636 | A1 | 7/2008 | Chidambarrao et al. |
| 2008/0242097 | A1 | 10/2008 | Boescke et al. |
| 2009/0104746 | A1 | 4/2009 | Clifton et al. |
| 2009/0166866 | A1 | 7/2009 | Fastow et al. |
| 2009/0221115 | A1 | 9/2009 | Scott et al. |
| 2009/0278201 | A1 | 11/2009 | Chatty et al. |

FOREIGN PATENT DOCUMENTS

| | | |
|---|---|---|
| WO | PCT/US/ 03/10180 | 10/2003 |
| WO | PCT/US 2005/025335 | 2/2006 |
| WO | PCT/US 2007/006171 | 9/2007 |
| WO | PCT/US11/033887 | 8/2011 |

OTHER PUBLICATIONS

Chung, et al. More Strain and Less Stress—The Guideline for Developing High-End Strained CMOS Technologies with Acceptable Reliability, National Chiao Tung University, Taiwan, 2008, pp. 435-438.

Doll, et al., "Versatile Low Temperature Wafer Bonding and Bond Strength Measurement by a Blister Test Method," Laboratory for Design of Microsystems, Institute for Microsystem Technologies (IMTEK), University of Freiburg, Georges-Koehler-Allee 102, 79110 Freiburg, Germany, Microsyst Technol (2006) pp. 418-429, Oct. 7, 2005.

Eernisse, "Stress in Ion-Implanted CVD Si3N4 Films," Sandia Laboratories, Albuquerque, New Mexico 87115, Journal of Applied Physics, vol. 48, No. 8, Aug. 1977, pp. 3337-3341.

Fischer et al., "Elastic Misfit Stress Relaxation in Heteroepitaxial SiGe/Si Mesa Structures," Institute of Semiconductor Physics, Frankfurt, Germany, Sep. 22, 1992, pp. 2656-2658.

Gannavaram, et al. "Low Temperature (≤800° C.) Recessed Junction Selective Silicon-Germanium Source/Drain Technology for Sub-70 nm Cmos," North Carolina State University, Raleigh, NC, pp. 437-440.

Harendt, et al., "Silicon Fusion Bonding and Its Characterization," Institute for Microelectronics Stuttgart, Allmandring 30a. D-7000 Stuttgart 80, Federal Republic of Germany, J. Micromech, Microeng 2 (1992) Sep. 1, 1992, pp. 113-116.

Hsu, et al., "Low Temperature LPCVD SiN Direct Bonding for Sensors," DIMES-ECTM, Delft University of Technology, Faculty of Electrical Engineering, Mathematics and Computer Science; DIMES-EI, Delft University of Technology, Faculty of Electrical Engineering, Mathematics and Computer Science, Dept. of Microelectronics, Mekelweg 4, 2628 CD Delft, the Netherlands; Oct. 2005, pp. 162-166.

Jain, et al., "Stresses and Strains in Lattice-Mismatched Stripes, Quantum Wires, Quantum Dots, and Substrates in Si Technology," Applied Physics Reviews, 79(11), Jun. 1996. pp. 8145-8165.

Jan, et al., "A 45mm Low Power System-Pm-Chip Technology with Dual Gate (Logic and I/O) High-k/Metal Gate Strained Silicon Transistors", Logic Technology Development, Intel Corporation, Hillsboro, Oregon.

Kawasaki et al., "Impact of Parasitic Resistance and Silicon Layer Thickness Scaling for Strained-Silicon MOSFETs on Relaxed Si1-xGex Virtual Substrate" SOC Research & Development Center and System LSI Division, Toshiba Corporation Semiconductor Company, Yokohama Japan.

Li, et al., "Systematic Low Temperature Silicon Bonding Using Pressure and Temperature," Department of Electrical and Computer Engineering, University of California Davis, Davis, CA 95616, USA, Jpn. J. Appl. Phys., vol. 37 (1998) pp. 737-741, Part 1, No. 3A, Mar. 15, 1998.

Miclaus, et al., "Wafer Bonding of (211) Cd0.96Zn0.04 Te on (001) Silicon," University of California, Los Angeles, Department of Materials Science and Engineering, Los Angeles, CA 90005; Raytheon Vision Systems, Goleta, CA 93117, pp. 552-555, Jun. 2004.

Shi, et al, "Modifying Residual Stress and Stress Gradient in LPCVD Si3N4 Film with Ion Implantation," National Key Laboratory of Nano/Micro Fabrication Technology, Institute of Microelectronics, Peking University, Beijing 100871, PR China, Nov. 21, 2005, pp. 352-357.

Tabata, et al., "Control of Internal Stress and Young's Modulus of Si3N4 and Polycrystalline Silicon Thin Films Using the Ion Implantation Technique," Toyota Central Research and Development Laboratories Inc., Nagakute-cho, Aichi-gun, Aichi-ken 480-11, Japan, American Institute of Physics, Appl. Phys. Lett 56 (14), Apr. 12, 1990 pp. 1314-1316.

Thompson, et al. "A 90-NM Logic Technology Featuring Strained-Silicon" Logic Technology Development, Intel Corporation, Hillsboro, OR, 2004, pp. 1790-1797.

Watanabe, et al., "A Low Power 40nm CMOS Technology Featuring Extremely High Density of Logic (2100kGate/nm2) and SRAM (0.195μm2) for Wide Range of Mobile Applications with Wireless System" System LS1 Division, Toshiba Corporation, Yokohama, Japan.

Wiegand, et al., "Wafer Bonding of Silicon Wafers Covered with Various Surface Layers," Max-Planck Institut für Mikrostrukturphysik, Weinberg 2, Halle an der Saale D-06120, Germany, CIS, Centrum für Mikrosensorik E.V., Haarbergstrasse 61, Erfurt D-99097, Germany, Elsevier Science B.V., Oct. 16, 2000, pp. 91-95.

Yamamoto, et al., "Effect of Low-Dose Ion Implantation on the Stress of Low-Pressure Chemical Vapor Deposited Silicon Nitride Films," ULSI Device Development Laboratories, NEC Corporation, Shomokuzawa 1120, Saganihara, Kanagawa, Japan, Jpn. J. Appl. Phys., vol. 37 (1998) pp. 1256-1259, Part 1, No. 3B, Mar. 3, 1998.

Yin, et al., "Strain Partition of Si/SiGe and SiO2/SiGe on Compliant Substrates," Applied Physics Letters, vol. 82, No. 22, Jun. 2003, pp. 3853-3855.

Yin, et al., "Uniaxial Strain Relaxation on Ultra-Thin Strained-Si Directly on insulator (SSDOI) Substrates," IEEE, May 2006.

* cited by examiner

TRANSISTOR WITH LONGITUDINAL STRAIN IN CHANNEL INDUCED BY BURIED STRESSOR RELAXED BY IMPLANTATION

CROSS REFERENCE TO RELATED APPLICATIONS

This application is a continuation of U.S. application Ser. No. 12/768,895, filed Apr. 28, 2010, entitled, "Transistor With Longitudinal Strain In Channel Induced By Buried Stressor Relaxed By Implantation" and incorporated by reference in its entirety.

BACKGROUND

1. Field of the Invention

The present invention relates to strained semiconductor devices that incorporate strained active layers and methods for making such devices. The invention more specifically relates to methods of making strained semiconductor devices in which biaxial strain can be provided to the active regions of small geometry devices.

2. Description of the Related Art

Strained silicon is widely viewed as an important technology for obtaining desired advancements in integrated circuit performance. Mobility enhancement results from a combination of reduced effective carrier mass and reduced intervalley (phonon) scattering. For MOS field effect transistors (MOSFETs) fabricated on conventional {100} oriented silicon substrates with conduction primarily along <110> crystal axes, n-channel MOSFETs achieve improved performance with induced biaxial tensile strain in the top silicon layer along both the width and length axes of the active area. p-channel MOSFETs exhibit improved performance with induced uniaxial tensile strain in the top silicon layer along the width axis only (transverse tensile strain). p-channel MOSFETs also exhibit improved performance with induced uniaxial compressive strain in the top silicon layer along the length axis only (longitudinal compressive strain). Compressive strain can be provided selectively in a silicon surface layer, for example, by using recessed selective epitaxial silicon germanium stressors in the source and drain regions of a MOSFET to induce a desired uniaxial compressive strain along the length axis (longitudinal).

Strained silicon is conventionally obtained by first growing a thick layer of silicon germanium alloy (SiGe) on a silicon substrate. The silicon germanium layer is grown to a sufficient thickness that the silicon germanium layer is relaxed to an unstrained condition at its surface. The in-plane lattice parameter of the silicon germanium surface is similar to that of a bulk crystal of silicon germanium of the same composition. Silicon germanium alloys have larger lattice parameters than silicon. Hence the relaxed surface of the silicon germanium layer provides an in-plane lattice parameter larger than that of silicon. A subsequent thin layer of silicon is grown epitaxially on the relaxed surface of the silicon germanium layer. The thin epitaxial layer of silicon assumes the larger in-plane lattice parameter of the silicon germanium and grows in a strained state with bonds in the crystal lattice elongated in the growth plane. This approach, sometimes known as substrate-strained silicon or "virtual substrate" technology, grows a thin pseudomorphic layer of silicon on the relaxed surface of a silicon germanium layer.

So long as the strained silicon layer does not exceed a "critical thickness" for strain relaxation and some care is taken, the tensile strain is maintained in the strained silicon layer throughout the various implantation and thermal processing steps typical of CMOS manufacturing.

The use of a relaxed silicon germanium layer as a "virtual substrate" to strain a subsequently deposited epitaxial silicon layer inevitably requires acceptance of a very high dislocation density in the silicon germanium layer because the silicon germanium relaxation mechanism is plastic in nature. In other words, relaxation in the silicon germanium layer occurs through the generation of strain-relieving misfit dislocations. A silicon germanium layer thinner than the critical thickness on a silicon substrate is not relaxed and exhibits few misfit dislocations. If the silicon germanium layer is thicker than the critical thickness, the strained lattice undergoes plastic deformation and the stress is relieved by the nucleation and propagation of misfit dislocations. Some fraction of misfit dislocations gives rise to threading dislocations (at least $10^4$-$10^5$ cm$^{-2}$) which propagate through the overlying strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

Contemporary FET and contact manufacturing strategies are illustrated in January, et al., "A 45 nm Low Power System-On-Chip Technology with Dual Gate (Logic and I/O) High-k/Metal Gate Strained Silicon Transistors," International Electron Devices Meeting (IEDM) 2008, and in Watanabe, et al., "A Low Power 40 nm CMOS Technology Featuring Extremely High Density of Logic (2100 kGate/mm$^2$) and SRAM (0.195 µm$^2$) for Wide Range of Mobile Applications with Wireless System," International Electron Devices Meeting (IEDM) 2008. These papers each describe high-density, low-power devices that can be used in system-on-chip applications such as are commonly used in wireless systems.

For very small geometry devices, it is common practice to use ion implantation to make parts of the source and drain regions of MOSFETs amorphous and, in particular, it is typical to make ultra-shallow source or drain extensions by first implanting to render at least the extension portions of the source and drain regions amorphous. This allows subsequent dopant implantation to be made shallower and with better control because the amorphous material limits the amount of channeling of the subsequently implanted dopants. This so-called "pre-amorphization" provides shallower dopant implant profiles and junctions. Solid-phase epitaxial regrowth by rapid thermal methods provides for minimal diffusion and high activation of implanted dopants.

SUMMARY OF THE PREFERRED EMBODIMENTS

Aspects of the present invention provide a method of manufacturing a semiconductor device including providing a substrate having a semiconductor surface layer. The substrate has a stressor layer positioned at a depth within the substrate and positioned adjacent the semiconductor surface layer, where the stressor layer is provided in a stressed state in comparison to the semiconductor surface layer. A gate structure is formed above the semiconductor surface layer. A first portion of the stressor layer under the gate structure is relaxed so as to strain a first portion of the semiconductor surface layer under the gate structure, the relaxing accomplished by implanting into second and third portions of the stressor layer aligned with second and third portions of the semiconductor surface layer. The method includes forming respective source and drain regions in at least a part of the second and third portions of the semiconductor surface layer.

Another aspect of the present invention provides a method of manufacturing a semiconductor device comprising providing a substrate having a semiconductor surface layer. The substrate has a stressor layer positioned at a depth within the substrate and positioned adjacent the semiconductor surface layer and the stressor layer is provided in a stressed state in comparison to the semiconductor surface layer. Trenches are formed to define a region on the substrate having trenches on at least two sides of the region, with two of the trenches defining the region separated by a first lateral extent. A plurality of gate structures are formed above the semiconductor surface layer in the region, with the gate structures extending between the trenches separated by the first lateral extent. First portions of the stressor layer under the gate structures are relaxed so as to strain first portions of the semiconductor surface layer under the gate structures, the relaxing accomplished by implanting ions through second and third portions of the semiconductor surface layer to reduce stress in at least the second and third portions of the stressor layer. Respective source and drain regions are formed in at least a part of the second and third portions of the semiconductor surface layer.

DETAILED DESCRIPTION OF THE PREFERRED EMBODIMENTS

Figure 1:
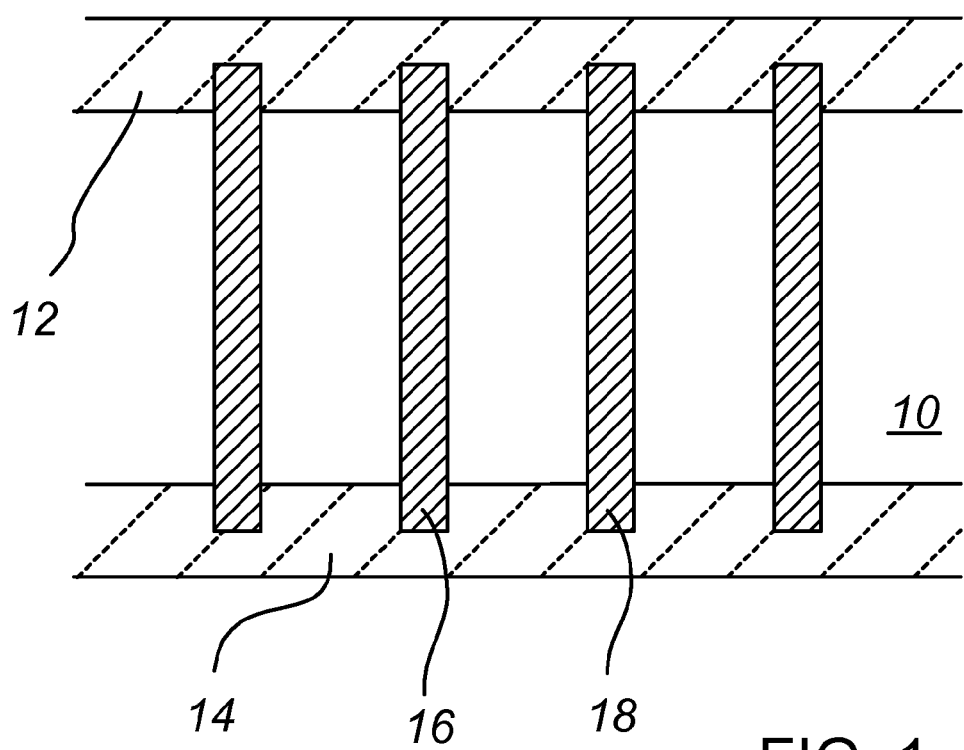
FIG. 1 illustrates in schematic plan view a configuration of field effect transistors and trench isolation structures that can benefit from certain aspects of preferred embodiments of the present invention.

Preferred embodiments of the present invention provide longitudinal strain to a channel region in a top semiconductor layer in a field effect transistor (FET) by providing a buried stressor layer and then relaxing elastically a portion of the buried stressor layer to induce strain in the channel region within the top semiconductor layer. For a preferred n-channel FET implementation, tensile strain is preferably induced along the longitudinal direction of the channel. Most preferably, implantation is used to cause the buried stressor layer to relax elastically beneath the channel of the FET. Relaxation of the buried stressor layer induces strain in the overlying top semiconductor layer, which provides improved device performance to an exemplary n-channel FET that forms a channel region in the strained top semiconductor layer. Subsequent processing continues to provide dielectric layers and interconnects and completes the FETs and other portions of the integrated circuit.

In particularly preferred implementations, processes for making field effect transistors relax a buried silicon germanium stressor layer to induce strain in an overlying silicon surface layer having a coherent interface with the buried stressor layer. The buried stressor layer preferably is relaxed and the surface layer is strained by implantation into at least the buried stressor layer, preferably on both sides of a portion of the surface layer that is to be strained. Implanting ions through the surface silicon layer and into the buried stressor layer on either side of the gate structure of the preferred FET can induce strain in the channel region of the FET. In some embodiments, the implantation renders portions of the buried silicon germanium layer amorphous to relieve strain in the buried silicon germanium layer and create strain in the silicon surface layer where it overlies the comparatively relaxed portion of the buried silicon germanium layer. In other embodiments, implantation can form point defects such as vacancies in the buried silicon germanium layer, the vacancies having a sufficient density to allow the stress in the buried silicon germanium layer to reduced locally. In other embodiments, implantation may induce dislocation loops in the regions of a crystalline buried stressor such as silicon germanium that are plastically relaxed.

The amorphization of a part of a buried silicon germanium layer acts to reduce the stress in that part of the layer and so permits some degree of elastic relaxation of the strain in adjacent parts of the buried silicon germanium layer that are not amorphized. For example, if two end portions of a strip of buried silicon germanium are implanted sufficiently to render them amorphous, those two portions of the silicon germanium will be relaxed, and the middle non-implanted portion of the silicon germanium strip will be relaxed elastically. The elastic relaxation of the middle, still-crystalline portion of the silicon germanium strip will be more complete for a shorter length of middle portion separating the two amorphous portions of the silicon germanium strip. The relaxation of the strain in the middle, crystalline portion of the buried silicon germanium layer in turn creates strain in the still-crystalline portion of the silicon layer overlying the still crystalline but at least partially elastically relaxed portion of the buried silicon germanium layer.

An alternative process performs ion implantation to create dislocation loops at or adjacent to the top or bottom interface of the stressor layer. The dislocation loops interact to become misfit dislocations at the interface between the stressor layer and the underlying silicon or at the interface between the stressor and the overlying silicon layer and in so doing significantly reduce the lateral stress in the stressor layer by plastic relaxation. Adjacent to the regions where the stressor layer is relaxed plastically, regions of the stressor layer that are not relaxed plastically are able to relax elastically to induce strain in the overlying semiconductor layer. For example when the stressor layer is silicon germanium and adjacent layers are silicon, the implanted regions of silicon germanium are damaged and relaxed plastically by misfit dislocations and adjacent undamaged regions of silicon germanium are able to expand laterally to induce a tensile strain in the silicon above and below the undamaged regions of silicon germanium stressor.

An advantage of the methods described for inducing strain in the semiconductor channel is that implantation is isolated to regions of the semiconductor body that do not affect the channel. Damage in the region between the source and drain is undesirable as it may adversely affect electron or hole mobility in the transistor channel, may adversely increase variability of threshold voltage or may adversely increase leakage current between source and drain when the transistor in its off state. Regions of semiconductor damage are preferably limited to highly doped source and drain regions where the effects of damage on device performance are relatively benign.

An alternative strategy introduces a high concentration of vacancies into a part of a buried silicon germanium layer, for example, by an appropriate implantation process. The high concentration of vacancies in the buried silicon germanium layer relaxes the strain in that part of the layer and so permits some degree of elastic relaxation of the strain in adjacent parts of the silicon germanium layer that are not substantially relaxed by introducing vacancies. Here again, vacancies can be introduced into two portions of a silicon germanium strip separated by a middle portion of the silicon germanium strip that remains crystalline and is relaxed elastically by the stress reduction in the two adjacent portions of the silicon germanium strip. Relaxing the strain in the still crystalline portion of the buried silicon germanium layer in turn creates elastic strain in the still crystalline portion of the overlying silicon layer between the implanted regions of the silicon germanium layer. The resulting tensile strain in the overlying portion of the silicon surface layer is desirable for device formation including for the channels of n-channel FETs and the active regions of other devices. An advantage of using a vacancy-induced stress relaxation mechanism is that the desired relaxation may be achieved without formation of misfit dislocations.

The strategies described here can be used to provide strained silicon channel regions for laterally closely spaced FETs, which can be difficult for currently advanced designs with small feature spacing. The next part of this discussion further illustrates the physical principles involved in the strain engineering discussed herewith reference to a patent. What is described in the patent can be used in combination with aspects of the strategies described and illustrated here.

U.S. Pat. No. 7,338,834, "Strained Silicon with Elastic Edge Relaxation," describes a strategy for effectively forming a strained silicon active layer by providing a sub-critical-thickness silicon germanium layer buried below an active layer of silicon. For present purposes, the term "critical thickness" is intended to denote the thickness above which a density of dislocations arises due to plastic relaxation sufficient to have a significant impact on the yield of integrated circuits manufactured using a substrate containing the stressor layer and the term "sub-critical-thickness" denotes a thickness of a strained layer sufficiently small for there to be a sufficiently low density of dislocations present in a finished integrated circuit product that the yield of such a product is not significantly reduced. The buried silicon germanium layer is stressed in its as-formed state and the active layer is unstrained in its as-formed state. The buried silicon germanium stressor layer induces strain in the silicon active layer, for example, in the process of forming trench isolation structures. In particular, trenches are etched through the silicon active layer, through the silicon germanium stressor layer and preferably into the substrate. Redistribution of strain from the buried stressor layer to the top semiconductor layer is accomplished by edge relaxation, as described in U.S. Pat. No. 7,338,834, which is incorporated by reference here for all purposes. By spacing the trenches appropriately around the entirety of the surface layer of a device, biaxial stress can be introduced to the top semiconductor layer of the device. Forming trenches surrounding a portion of a substrate or a device is not always practical or desirable, particularly in the geometries discussed in the next section. For such smaller geometries, aspects of the present invention can be utilized to provide strain in a surface silicon layer even when there is not enough room to form trenches. In particularly preferred implementations, aspects of the patent's strain engineering are used in combination with aspects of the present invention to provide two dimensional strain engineering.

Watanabe, et al., in the article "A Low Power 40 nm CMOS Technology Featuring Extremely High Density of Logic (2100 kGate/mm$^2$) and SRAM (0.195 µm$^2$) for Wide Range of Mobile Applications with Wireless System," International Electron Devices Meeting (IEDM) 2008 describe forming field effect transistors where no trench isolation structure is formed between adjacent FETs. There are instances where no isolation trench is etched between adjacent FETs and the active region of each FET may be spaced a large distance from a trench parallel to the transverse direction. Consequently, it may be difficult to apply the methods described in U.S. Pat. No. 7,338,834 to induce longitudinal strain in the top semiconductor layer in the active region of at least some FETs in the configurations illustrated in the Watanabe, et al., article. FETs in the configurations illustrated in the Watanabe, et al., article may not have desired properties even if the FET active regions are in thin silicon layers over a silicon germanium stressor layer, for the reasons discussed in U.S. Pat. No. 7,338,834. Such FET configurations are typical in high density static random access memory (SRAM) cell layouts where a majority of the n-channel FETs in particular have active regions uninterrupted by trench isolation along the longitudinal direction.

A preferred implementation of the present invention provides a semiconductor substrate that has a semiconductor stressor layer buried beneath a semiconductor surface layer. The surface layer is most often a thin layer of silicon and the buried stressor layer can be silicon germanium having an appropriate germanium concentration and thickness, with the thickness and composition of the surface and stressor layers having characteristics selected according to the discussion in the above-incorporated patent. Processing provides gate structures including conductive gates and insulation for at least two FETs positioned close to one another with no trench isolation structure formed between the at least two FET gate structures. The gates of the at least two FETs are generally parallel to each other over their respective active regions, but there may be some variations from a generally parallel arrangement, so long as the process here provides longitudinal strain to the top semiconductor layer of one or more of the at least two FETs. Following formation of the gate structures, preferred embodiments preferably implant atoms into the silicon surface layer and the silicon germanium layer so as to relax the silicon germanium layer. As discussed in further detail below, relaxation can be accomplished, for example, by rendering the silicon germanium amorphous in one or more regions adjacent to the silicon germanium underlying the channel region or by creating vacancy structures or a suitable concentration of strain-relieving dislocations in the silicon germanium adjacent to the silicon germanium underlying the channel region. Processing generally then continues to form source and drain regions by implanting appropriate dopant atoms into the substrate. The strain creation process described here is consistent with known source and drain formation processes, including shallow source drain (traditionally termed low-doped drain, LDD) extension processes. The amorphization strain creation process is particularly well suited for use with a shallow source or drain extension process because the amorphization used to relax the silicon germanium layer and create strain in the surface silicon layer is useful in controlling the dopant implantation depth and distribution for the shallow extension. Of course, if no extension is used, typical source or drain creation processes can be used.

This disclosure incorporates by reference the text and teachings of U.S. Pat. No. 7,338,834, entitled "Strained Silicon with Elastic Edge Relaxation," in its entirety. U.S. Pat. No. 7,338,834 discusses elastic edge relaxation and its use in effectively creating strained silicon regions and the patent is specifically incorporated in its entirety for its teachings with respect to stress relaxation and forming strained regions of a material. In certain preferred embodiments, isolation trenches are used to partially isolate individual FETs or groups of FETs. These isolation trenches preferably are positioned with respect to portions of a FET or group of FETs to facilitate or cause edge relaxation and to allow a buried stressor layer to in part transfer stress to an overlying active layer. This induced strain operation is as described in U.S. Pat. No. 7,338,834.

In some of the preferred implementations described here, isolation trenches may only be near portions of the active region of each FET and so the isolation trenches might provide edge relaxation only to the portions of the FETs that are close to the isolation trenches. FIG. 1 schematically illustrates a layout in which a substrate 10 is provided with isolation trenches 12, 14 that isolate a set of transistors arranged along a strip of silicon of the substrate 10. As illustrated in plan view in FIG. 1, the gates 16, 18 of the array of transistors may be provided sufficiently close to preclude forming isolation trenches between adjacent gates along the strip. In alternate implementations, the configuration illustrated in FIG. 1 may be selected to facilitate formation of common contacts, even in situations where process considerations would allow formation of isolation trenches between gates along the strip. Because of the arrangement of the FETs along the strip that does not form isolation trenches between adjacent FETs, trenches are not readily used to transfer longitudinal stress from an underlying stressor layer to an overlying semiconductor layer.

Figure 2:
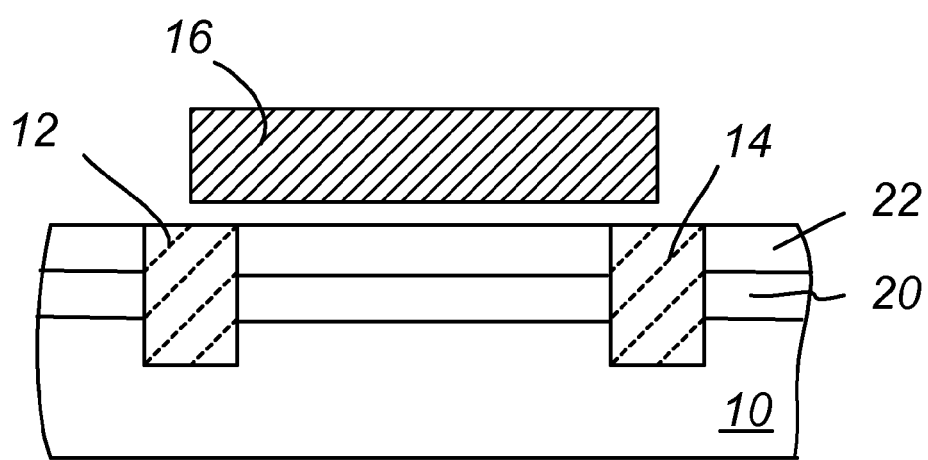
FIG. 2 schematically illustrates a cross sectional view through one of the field effect transistor gates in the configuration of FIG. 1.

FIG. 2 illustrates a cross section through the strip of FIG. 1 and specifically through gate 16. As illustrated, the substrate 10 has a buried stressor layer 20 that may be a silicon germanium layer as described in U.S. Pat. No. 7,338,834. The silicon germanium layer may have an atomic germanium fraction of between about 10% to 100% or, equivalently, an x value of from about 0.1 to 1.0 in $Si_{1-x}Ge_x$. Alternatively, the buried stressor layer may be another appropriate stressor material. The substrate 10 preferably may be a silicon substrate or a silicon-on-insulator substrate or other substrate. As discussed in the patent, preferred silicon germanium stressor layer 20 is formed in a compressively stressed state. The buried silicon germanium stressor layer 20 induces strain in the upper silicon layer 22 when the isolation trenches associated with isolation structures 12, 14 are etched through the upper silicon layer 22 and the buried stressor layer 20. In preferred implementations, the illustrated trenches are sufficiently close together to allow for edge relaxation and induced strain across substantially the entire lateral extent of the upper silicon layer 22. On the other hand, the implant-induced relaxation strategies described below are advantageously applied whether or not the upper silicon layer is stressed across the width illustrated in FIG. 2.

Figure 3:
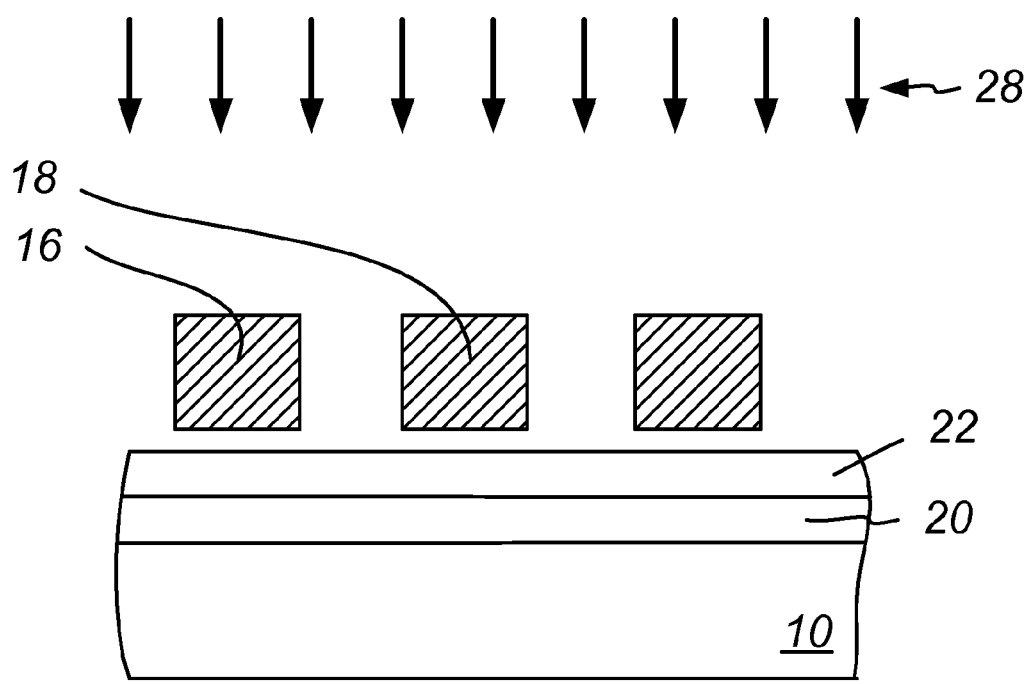
FIGS. 3-4 illustrate processes according to aspects of the present invention for forming a longitudinal strained silicon surface region that may be provided in a configuration like that illustrated in FIGS. 1 and 2 or may be provided in another configuration.
Figure 4:
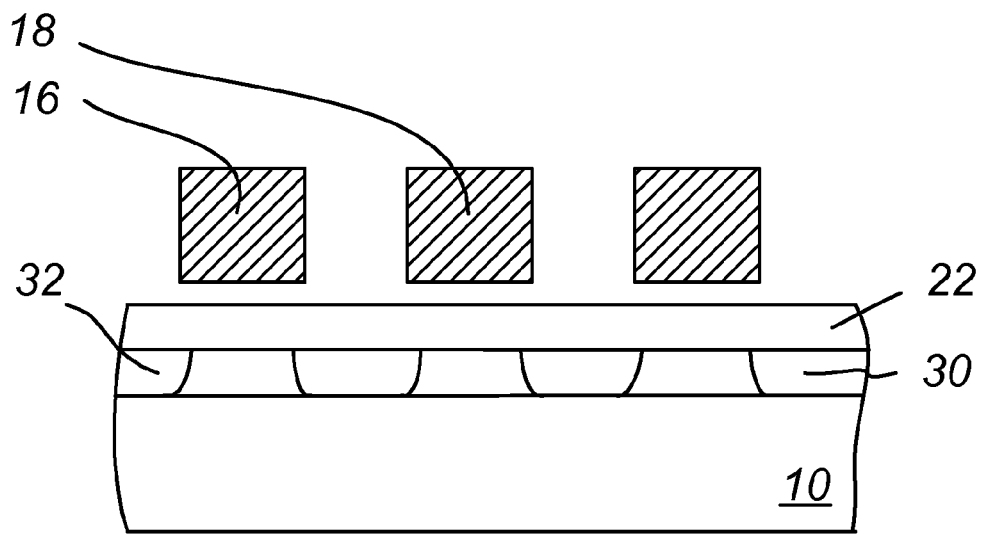

Conventional or more advanced processing is performed to form the gate structures, including gate dielectrics and gate electrodes to provide the structure schematically illustrated in cross section in FIG. 2. One FET including a gate electrode 16 is illustrated schematically in FIG. 2. Preferably the upper silicon layer 22 is stressed under the entire transverse lateral extent of the gate electrode 16 to provide transverse stress, in the manner discussed in U.S. Pat. No. 7,338,834 in those instances where it is desired. FIG. 3 illustrates schematically three transistors in cross section, with gate electrodes 16, 18 shown and other structures such as gate insulating structures not shown. Prior to implantation, the upper silicon layer 22 in FIG. 3 is not strained in the longitudinal direction (which is in plane in the illustration) because stressor layer relaxation has not occurred in the longitudinal direction. Implantation of appropriate ions 28 through desired portions of the surface silicon layer 22 not protected by the gates 16, 18 is then performed to desired portions 30, 32 of the buried stressor layer 20 to relax portions of the buried stressor layer adjacent to the implanted portions of the buried stressor layer 20, as illustrated in FIG. 4. As discussed in the following, different strategies can be used for reducing the stress in implanted portions of the stressor layer and elastically relaxing the adjacent portions of the buried stressor layer that do not have stress reduced by implantation.

In preferred methods described here, longitudinal tensile strain is induced in the channel region of a transistor with a buried compressive silicon germanium layer between its source and drain by relaxing the strain locally in at least a part of the source and a part of the drain region. The local stress relaxation is induced by amorphizing to a depth at least as deep as the bottom interface of the silicon germanium layer by implanting a sufficiently high dose of ions. Alternatively the local stress relaxation is induced by introducing a high concentration of vacancies or dislocations in the vicinity of exposed portions of the silicon germanium layer by implanting a sufficiently high dose of ions into those regions.

When the amorphization method is applied, the amorphized regions are subsequently regrown to be substantially single crystal by solid-phase epitaxial regrowth ("SEG") in a thermal annealing step after the amorphization step. Solid-phase epitaxial regrowth by rapid thermal methods provides for minimal diffusion and high activation of implanted dopants, when present, both of which are desirable attributes. When the amorphization method is applied to a buried silicon germanium stressor layer in combination with a semiconductor surface layer of silicon, the ion species used to cause amorphization may be ions of elements such as argon or silicon that do not significantly modify the electrical properties of silicon or ions of species such as germanium or arsenic that do modify the electrical properties of silicon.

The regions that are affected by the stress-reducing ion implantation are defined by the gate pattern in that gate structures overlying channel regions absorb the incoming ions and protect the channel regions from exposure to ion impact. Gate structures may consist of the gate dielectric and electrode alone or the gate dielectric and electrode with the addition of sidewall spacers formed along its sidewalls. Standard processes are known in the industry for formation of gate sidewall spacers by conformal deposition of a thin film followed by anisotropic etching of the thin film. The gate structure may consist of a sacrificial gate, for example formed of polysilicon, which serves as a template structure for transistor construction purposes and is later replaced by a metal gate electrode in a "replacement metal gate" process. Furthermore the gate sidewall spacers may be sacrificial, used for the purpose of locating the implant regions and later removed. The use of sacrificial sidewall spacers allows the positioning of the implant regions to be decoupled from the placement of the shallow doped extension or deep doped source/drain regions allowing for greater flexibility in achieving optimal strain and doping profiles in transistor structures.

It is preferred for the purposes of this invention that the amorphized region of semiconductor be at least as deep as the bottom interface of the buried silicon germanium layer. The amorphization may precede implantation of n-type dopants in the shallow source/drain extension regions of n-channel MOSFETs or may be concomitant with implantation of n-type dopants in the shallow source/drain extension regions of n-channel MOSFETs. The amorphization may precede implantation of n-type dopants in the deep source/drain regions of n-channel MOSFETs or may be concomitant with implantation of n-type dopants in the deep source/drain regions of n-channel MOSFETs. The implantation of ions may be done at an angle normal to the wafer surface or at another angle not normal to the wafer surface. Use of off-normal or "tilted" implants allows a further degree of control over the placement of the amorphized regions with respect to the channel region of a transistor.

The amorphization of a part of a buried silicon germanium layer acts to reduce the stress in that part of the layer and so permit some degree of elastic relaxation of the strain in adjacent parts of the silicon germanium layer that are not amorphized.

Modification by amorphization of the strain in a silicon channel has been demonstrated and reported in an article by IBM (Yin et al, "Uniaxial Strain Relaxation on Ultra-Thin Strained-Si Directly On Insulator (SSDOI) Substrates," 8th International Conference on Solid-State and Integrated Circuit Technology, 2006). In that article, the authors describe how amorphization of regions of tensile strained silicon adjacent to a channel region causes a reduction of strain in the channel region. The article also describes recrystallizing the region made amorphous through implantation through lateral solid phase epitaxy. The intention of the work described in the IBM article was to deliberately reduce the longitudinal tensile strain in the channel regions of p-channel MOSFETs where it is not favorable to transistor performance, which is contrary to the creation of strain in the channel of an n-channel FET that is described here.

The article by Hollander, et al., "Strain Relaxation of Pseudomorphic SiGe—Si (100) Heterostructures by Si+ Ion Implantation," Nuclear Instruments and Methods in Physics Research B 242 (2006), discusses strain relaxation in pseudomorphic silicon germanium layers (with a molar germanium concentration of x=0.21-0.33). The silicon germanium layers were grown by chemical vapor deposition or molecular-beam epitaxy on a (100) face of silicon or silicon-on-insulator, which was subjected to a low-fluence ($2\times10^{14}$ cm$^2$) silicon ion implantation followed by annealing. Strain relaxation of up to 75% of the initial pseudomorphic strain was observed at temperatures as low as 850° C. after implantation of silicon ions at such low fluences.

An alternative method of relaxing a buried strained silicon germanium layer is to introduce a high concentration of vacancies into a part of a buried silicon germanium layer. The vacancies act to relax the strain in that part of the layer and so permit some degree of elastic relaxation of the strain in adjacent parts of the silicon germanium layer that do not have a high concentration of vacancies and still are crystalline.

In another embodiment of the invention, a high concentration of point defects is induced by high dose ion implantation in the vicinity of a buried pseudomorphic silicon germanium layer at opposite ends of a transistor channel. The concentration of point defects is less than a concentration required to cause amorphization of the crystal silicon germanium lattice. Interstitial point defects diffuse rapidly away from the silicon germanium layer while vacancy defects accumulate in the silicon germanium layer where they cause a local reduction of the compressive strain in the silicon germanium layer at opposite ends of the channel region. Adjacent portions of the silicon germanium layer that underlie the transistor channel region and that are hence not exposed to the ion implantation causing point defects remain under compressive stress. The compressive stress is relieved elastically as the adjacent relaxed silicon germanium regions permit the compressive stress to be relieved by lateral movement of the atoms in the silicon germanium layer underlying the channel and hence tensile strain is induced in the overlying channel layer which is predominantly silicon.

The A. F. Vyatkin article titled "The role of point defects in strain relaxation in epitaxially grown SiGe structures," published in Thin Solid Films (2005), is an illustration of how creating a high concentration of point defects by implantation can relax the stress in a buried layer of compressively stressed silicon germanium. According to Vyatkin, "the atomic density of the pseudomorphic SiGe film is higher than that of the fully relaxed film due to the lattice parameters difference between the Si substrate and the SiGe film (although the SiGe lattice is enlarged in the out-of plane direction according to the Poisson ratio; nevertheless, this does not compensate for in-plane lattice contraction). This means that strain relaxation in such a system should consist in the atom redistribution to restore the intrinsic atomic density of the SiGe film." Considering "point defects (vacancies and interstitials) introduced into the Si substrate of the SiGe/Si epitaxial heterostructure nearby the interface from an external source. If the diffusion mobility of point defects is high enough, which is valid for vacancies and interstitials in Si and SiGe at elevated temperatures, they would diffuse from the place of origination (for example, from a collision cascade) in different directions. For vacancies, it is energetically more favorable to diffuse into the SiGe layer because this layer is contracted while interstitial atoms would concentrate in the Si layer near the interface because this layer is under tensile stress. Coming into the SiGe layer, vacancies would decrease the atomic density of the layer down to the atomic density of a fully relaxed SiGe film. This can be done through an atomic rearrangement of atoms and vacancies, which would give rise to an atomic lattice of the SiGe film with an intrinsic atomic density (or lattice parameter) and without vacancies consumed during the atomic rearrangement. This means that strain relaxation can occur via atomic rearrangement of an initially strained layer at the expense of misfit elastic energy." According to the mechanism proposed by A. F. Vyatkin, stress relaxation can be obtained in pseudomorphic, in-plane compressively stressed silicon germanium layers through the action of vacancies on the silicon germanium lattice, without a requirement to amorphize the silicon germanium layer. The vacancies can be formed by implanting silicon ions, argon ions, or other ions as appropriate.

For the embodiments that incorporate implantation into the stressor layer, implanting to form source and drain regions, including forming shallow extensions as desired, including selective shallow amorphization, can be performed during, before or after the implantation step used to reduce the stress in the buried stressor layer. Preferably a restricted thermal annealing that does not substantially alter the vacancies or the relaxation is used to activate the source/drain dopant implantation, as desired, following relaxation.

Following stressor layer relaxation, strain creation in the channel, and source/drain formation, processing continues from the FIG. 4 illustrated stage to complete the fabrication of the FETs and connect them in the desired manner. It should be appreciated that in FIG. 4 and the other drawings only a portion of a much larger wafer or workpiece is shown.

In the implementations discussed here, it is possible to provide biaxial strain to the active region of a FET using a combination of trench isolation structures extended through the buried stressor layer and into the substrate and ion implant-induced stress reduction in the source and drain regions. Such biaxial strain is most advantageous for n-channel FETs.

As discussed above, different materials can be selected as stressor layers. In addition to silicon germanium, primarily discussed above, a thin film of silicon nitride or silicon oxynitride deposited with a built-in stress or having a stress induced after deposition can be provided as a stressor layer. Providing silicon nitride or silicon oxynitride as a stressor layer may have important advantages in manufacturing over silicon germanium, for example where it is desired to have field effect transistors formed in silicon-on-insulator (SOI) wafers. Using silicon nitride as a buried stressor layer provides additional flexibility because silicon nitride can be deposited in either a compressive or tensile stressed state and can therefore be used to induce either tensile or compressive stress in an overlying silicon surface layer through elastic edge relaxation of the silicon nitride layer.

A silicon nitride buried stressor layer may be provided by wafer bonding techniques. For example, various methods for forming a buried stressed silicon nitride or silicon oxynitride layer by wafer bonding are described in U.S. Pat. No. 6,707,106 to Wristers, et al., which is incorporated by reference here for these and its other teachings. The stressed silicon nitride layer may have a silicon oxide layer on one or both of its upper and lower faces. If a silicon oxide layer intervenes between the stressed silicon nitride and the top semiconductor active layer, the silicon oxide-semiconductor interface may have superior electrical properties in comparison with a silicon nitride-silicon interface. On the other hand, the stress induced in the top semiconductor layer by edge relaxation may be less if the intervening silicon oxide layer acts as a stress buffer due to its lower viscosity if heated above the glass transition temperature and its lower elastic modulus. Therefore in some circumstances it may be preferred to have the buried silicon nitride layer in direct contact with the top semiconductor active layer.

Implanting ions into tensile stressed silicon nitride can be used to reduce the tensile stress in the silicon nitride layer. When such implantation is performed into two regions of a buried tensile stressed nitride layer separated by an unimplanted portion of stressed nitride layer, the stress in the implanted regions can be reduced and can relax a portion of the buried tensile stressed silicon nitride layer that was not implanted and induce in-plane compressive strain in a portion of a semiconductor layer overlying the portion of the buried tensile stressed silicon nitride layer that was not implanted.

The stressed silicon nitride layer may be deposited on a donor silicon wafer, for example by plasma enhanced chemical vapor deposition (PECVD) or by low pressure chemical vapor deposition (LPCVD). By varying input factors in a PECVD process, predictable amounts of either tensile or compressive built-in stress in the range 1.7 GPa tensile to 3.0 GPa compressive can be selectively incorporated in a deposited silicon nitride thin film. A thin film of silicon dioxide may then be deposited on the nitride film on the donor wafer. The layered silicon—silicon nitride—silicon dioxide donor wafer so formed may then be bonded to a silicon handle wafer using a standard method for wafer bonding involving a combination of applied pressure and thermal annealing as widely practiced in the semiconductor industry and described in the above-incorporated Wristers patent. The silicon handle wafer may optionally have a silicon dioxide formed upon it before the wafer bonding is performed to facilitate or improve the bonding process. Subsequently a majority of the donor wafer may be removed by a standard wafer separation process, such as the Smart Cut™ process employed by SOITEC Silicon On Insulator Technologies, a company of Bernin, France, leaving a thin layer of silicon of desired thickness attached to the silicon nitride layers.

In the above described implementations, a suitable substrate might be a silicon wafer or a silicon-on-insulator (SOI) substrate. Other semiconductors may be used as the substrate in different applications. One example of a suitable stressor layer for this implementation is silicon germanium, formed to less than its critical thickness. Another example might be silicon nitride deposited in an appropriately stressed state, which might be tensile or compressive for different applications. There are various ways known in the art for forming a semiconductor substrate with a buried stressor layer. Regardless of the type of stressor layer and how it is formed, particularly preferred embodiments of the present invention provide a semiconductor surface layer that is formed into an active region for a device such as a FET. The semiconductor surface layer may be silicon, germanium, or carbon in the form of graphene, a compound semiconductor containing group four elements, a compound semiconductor containing group three and group five elements, or a compound semiconductor containing group two and group six elements. For a silicon surface layer, an active region having biaxial stress is most advantageous for n-type FETs and the preferred stressor layer is one that has compressive stress as formed within the buried stressor substrate, which is the case for the preferred silicon germanium layer. Appropriate germanium concentration levels may be, for example, on the order of 10% to 100% and the thickness of such a compressively stressed silicon germanium layer is desirably close to, but less than, the critical thickness for such a layer. Critical thicknesses vary according to composition and are known and can be calculated for various concentrations of germanium within silicon germanium on a silicon substrate. For practical purposes, critical thickness values are more likely determined by experiment: In the particular case of MOSFETs, the critical thickness being determined as the thickness value above which an intolerable reduction of integrated circuit product yield is obtained due to generation of misfit dislocations.

Preferred processes including those described above can select and to some extent control the relative amounts of stress directed along each of the primary axes of a semiconductor device, for example, corresponding to the width axis and length axis of a FET. The amount of stress applied along the longitudinal direction is determined in part by positioning the damaged or implanted regions within the buried stressor layer. The positioning of the damaged or implanted regions is in turn determined by the width of spacers on the gate sidewalls and the angle at which the ions are implanted. Generally the spacing under these configurations is sufficiently small to allow for effective relaxation and induced stress from the silicon germanium or other stressor layer to the silicon or other active layer. Where longitudinal tensile strain is not desired along the longitudinal axis in the semiconductor surface layer of a semiconductor device, for example in p-channel FETs, preferably stress-modifying implant regions are not introduced into the buried layer so the effect of the elastic relaxation mechanism induced by implantation is avoided.

In another embodiment, the buried stressor layer and the surface semiconductor active layer can be formed later in the course of processing. In particular, the workpiece or wafer may be a conventional silicon or SOI wafer that is processed in the conventional manner through the patterning of trenches for trench isolation structures. The trenches may then be filled with an insulator that is either somewhat compliant or that can be removed. Preferred implementations of this aspect then proceed to selectively deposit first a buried stressor layer and then a surface silicon layer as desired on the wafer. In one implementation, both the buried stressor layer and the surface silicon layer could be deposited only on portions of the substrate where biaxial stress is preferred in the surface silicon layer. For example, the selective deposition might deposit buried stressor material and surface silicon only on those regions where n-channel FETs are to be formed. This process of selective deposition can be achieved, for example, if the trench isolation structures are filled with an appropriate material such as silicon oxide and the other portions of the wafer that are to not receive the stressor layer are covered with a masking layer of silicon oxide. Then silicon germanium (as a buried stressor layer) followed by silicon (as a surface active layer) are selectively deposited on the exposed silicon surfaces of the substrate using well known selective deposition processes. The masking silicon oxide can then be removed and the wafer subjected to further processing to form devices including FETs. The implantation relaxation processes illustrated in FIGS. 3-4 can be practiced on those portions of the substrate in which a buried stressor layer and a surface silicon layer are formed.

Alternately, this embodiment may selectively deposit the buried stressor material on those locations where biaxial stress is preferred for the surface silicon layer and deposit the surface silicon layer over all of the active regions on the substrate. This process is like that described in the previous paragraph through the selective deposition of the buried stressor layer. After that process, the masking silicon oxide would be removed and then silicon would be selectively deposited on the exposed silicon and buried stressor layer surfaces. Processing continues on the different portions of the wafer as set out in the earlier discussion.

In still another variation, both a buried stressor layer and a surface silicon layer can be selectively deposited on all of the active regions exposed on the surface of the wafer. Most preferably, the buried stressor layer and the surface silicon layer are not deposited on the portions of the wafer where trench isolation structures are present, because the trench isolation structures have on their surfaces an appropriate material such as the silicon oxide used to fill the trenches. Following the selective deposition, processing continues as discussed above with respect to FIGS. 3-4.

For all of these selective deposition embodiments, the buried stressor layer and the surface layer can have the characteristics and properties (such as thickness and composition) discussed above or in the discussions in U.S. Pat. No. 7,338,834. For example, appropriate thickness (i.e., below critical thickness) layers of silicon germanium can be selectively deposited as a buried stressor layer and an appropriate thickness of silicon can be selectively deposited as an active layer.

When an appropriate buried stressor layer and an appropriate surface layer are selectively deposited on an appropriate size region of a wafer, the buried stressor layer may induce stress in an overlying silicon surface layer across the extent of one (uniaxial) or two (biaxial) lateral extents. Here, an appropriate size region of a wafer refers to a lateral dimension of the region. For a sufficiently small lateral dimension along one axis, the buried stressor layer can induce strain across the extent of the overlying silicon surface active layer along that axis. For sufficiently small lateral dimensions along two axes, the buried stressor layer can induce biaxial stress across the lateral extent of the surface silicon active layer along the two axes. For these small lateral dimensions, the buried stressor layer and the surface layer are in an equilibrium stress state as they are grown and so the surface layer is desirably stressed in its grown state, so long as the layer is sufficiently thin as to not relax its surface though a plastic deformation mechanism such as generation of misfit dislocations. The dimensions appropriate for the substrate region on which to selectively deposit the buried stressor layer and the surface active layer are the same as those identified for trench separations in U.S. Pat. No. 7,338,834. When bilateral strain within a surface active layer is accomplished using selective deposition on an appropriately sized region of the substrate, the lateral extent of the region of the substrate is defined by surrounding trenches of trench isolation structures. In essence, this selective deposition process produces similar results structurally and functionally as illustrated and discussed in U.S. Pat. No. 7,338,834.

When this selective deposition process is used to provide a strip of active silicon like that illustrated in FIGS. 1 and 2, the trenches 12, 14 are preferably spaced sufficiently closely to achieve some degree of buried stressor relaxation and surface layer stress over the lateral extent between the trenches. At this stage of processing, the surface active layer has been subjected to uniaxial stress. In some implementations that may be the only stress applied. Further processing such as annealing of the trench fill material or replacement of the trench fill material could then be performed to provide a desirably rigid trench insulation material for further processing. After appropriately rigid trench insulation material is provided, the processes described above with respect to FIGS. 3-4 may be performed as desired to provide relaxation along a second axis so as to provide biaxial stress to the surface layer.

For the selective deposition implementations described above, the isolation trenches are desirably filled with an appropriate material to facilitate selective deposition. This material desirably is also sufficiently compliant to allow the relaxation of the stressor material and the surface layer during growth. If the material is not sufficiently compliant, it may be necessary to remove the material to efficiently induce stress in the surface layer. Generally it is desirable to grow or deposit a dense silicon oxide or silicon nitride liner layer on the walls of the trench and to then fill the trench with additional appropriate material. One preferred compliant material for filling the isolation trenches is silicon oxide deposited by chemical vapor deposition from a tetra ethyl ortho-silicate (TEOS) vapor source. Generally this material is sufficiently compliant to allow for desired induced strain within the surface layer. After the selective deposition processes, the TEOS silicon dioxide is subsequently densified by thermal annealing according to standard procedures well known in the industry. Annealed TEOS trench fill generally gives rise to additional tensile strain in the system which is applied laterally to the active layer or silicon surface layer. Whether or not the TEOS or other material is sufficiently compliant to allow stress to be induced in the surface layer, it is possible to remove the initial trench fill material and replace that material with conventional trench isolation fill materials.

Following the selective deposition processes and trench fill processes described above, further processing as illustrated in FIGS. 3-4 can be performed as desired to produce FETs having uniaxially or biaxially strained surface layers such as uniaxially or biaxially strain silicon active layers. Certain preferred embodiments provide n-channel FETs having biaxially strained silicon active layers.

The strain induced into the upper silicon layer by this method may in general be non-uniform in its distribution but is of sufficient magnitude to improve the in-plane electron mobility or hole mobility or both to a desirable extent and hence to improve the electrical performance of MOS transistors having channels at least in part formed in the layer. As such, the method permits the fabrication of strained bulk MOS devices and strained MOS SOI devices with potentially low cost and low defect counts compared to conventional methods.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

I claim:

1. A method of manufacturing a semiconductor device, comprising:
    providing a substrate comprising a wafer, a semiconductor surface layer, a silicon oxide layer and a silicon germanium stressor layer positioned within the substrate so that the silicon oxide layer and the stressor layer are between the wafer and the semiconductor surface layer, a stressed region of the stressor layer adjacent the silicon oxide layer, wherein the stressed region of the stressor layer is in a stressed state in comparison to the wafer;
    forming trenches to define a region on the substrate having trenches on at least two sides of the region, two of the trenches defining the region separated by a first lateral extent;
    forming a plurality of gate structures above the semiconductor surface layer in the region, the gate structures extending between the trenches separated by the first lateral extent;
    relaxing first portions of the stressor layer under the gate structures so as to strain first portions of the semiconductor surface layer under the gate structures, the relaxing accomplished by implanting ions through second and third portions of the semiconductor surface layer and into second and third portions of the stressor layer to reduce stress in at least the second and third portions of the stressor layer; and
    forming respective source and drain regions in at least a part of the second and third portions of the semiconductor surface layer.

2. The method of claim 1, wherein the semiconductor surface layer comprises silicon and the relaxing induces longitudinal strain within the first portions of the semiconductor surface layer to provide a longitudinally strained channel region of a field effect transistor that includes one of the gate structures and one set of source and drain regions.

3. A method of manufacturing a semiconductor device, comprising:
    providing a substrate comprising a wafer, a semiconductor surface layer, a silicon oxide layer and a silicon nitride stressor layer positioned within the substrate so that the silicon oxide layer and the stressor layer are between the wafer and the semiconductor surface layer, a stressed region of the stressor layer adjacent the silicon oxide layer, wherein the stressed region of the stressor layer is in a stressed state in comparison to the wafer;
    forming trenches to define a region on the substrate having trenches on at least two sides of the region, two of the trenches defining the region separated by a first lateral extent;
    forming a plurality of gate structures above the semiconductor surface layer in the region, the gate structures extending between the trenches separated by the first lateral extent;
    relaxing first portions of the stressor layer under the gate structures so as to add strain in first portions of the semiconductor surface layer under the gate structures by implanting ions through second and third portions of the semiconductor surface layer and through second and third portions of the silicon oxide layer and into second and third portions of the stressor layer to reduce stress in at least the second and third portions of the stressor layer; and
    forming respective source and drain regions in at least a part of the second and third portions of the semiconductor surface layer.

4. The method of claim 3, wherein the wafer is silicon, the stressor layer is silicon germanium and the strain added in first portions of the semiconductor surface layer is tensile strain.

5. The method of claim 1, wherein the wafer is silicon and the strain added in first portions of the semiconductor surface layer is tensile strain.

* * * * *